(12) United States Patent
Lines et al.

(10) Patent No.: US 6,320,777 B1
(45) Date of Patent: Nov. 20, 2001

(54) DYNAMIC CONTENT ADDRESSABLE MEMORY CELL

(75) Inventors: Valerie Lines, Ottawa; Peter B. Gillingham, Kanata; Abdullah Ahmed, Scarborough; Tomasz Wojcicki, Kanata, all of (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 09/533,128

(22) Filed: Mar. 23, 2000

(30) Foreign Application Priority Data

Mar. 31, 1999 (CA) .................................................. 2266062

(51) Int. Cl.$^7$ .................................................. G11C 15/00
(52) U.S. Cl. ........................................ 365/49; 365/189.07
(58) Field of Search .................................. 365/49, 189.07

(56) References Cited

U.S. PATENT DOCUMENTS

| | | |
|---|---|---|
| 3,701,980 | 10/1972 | Mundy . |
| 4,791,606 * | 12/1988 | Threewitt et al. ...................... 365/49 |
| 4,823,313 | 4/1989 | Kadota . |
| 4,831,585 | 5/1989 | Wade et al. . |
| 4,833,643 | 5/1989 | Hori . |
| 4,965,767 * | 10/1990 | Kimoshita et al. ..................... 365/49 |
| 5,111,427 | 5/1992 | Kobayashi et al. . |
| 5,146,300 | 9/1992 | Hamamoto et al. . |
| 5,319,589 | 6/1994 | Yamagata et al. . |
| 5,396,449 | 3/1995 | Atallah et al. . |
| 5,446,685 | 8/1995 | Holst . |
| 5,515,310 | 5/1996 | Winters . |
| 5,859,791 | 1/1999 | Shultz et al. . |
| 5,930,161 * | 7/1999 | Sheikholeslami et al. ............. 365/49 |
| 5,949,696 * | 9/1999 | Threewitt ................................ 365/49 |
| 6,044,005 * | 3/2000 | Gibson et al. .......................... 365/49 |

OTHER PUBLICATIONS

Kenneth J. Schultz, "A Survey of Content–Addressable Memory Cells," VLSI Journal, vol. 23, pp. 171–188, 1997.
Joseph L. Mundy et al., "Low–Cost Associative Memory," IEEE Journal of Solid–State Circuits, sc–7, pp. 364–369, 1972.
Sergio R. Ramirez–Chavez, "Encoding Don't Cares in Static and Dynamic Content–Addressable Memories," IEEE Transactions on Circuits and Systems II: Analog and Digital Signal Processing 39, No. 8, pp. 575–578, Aug. 1992.
Hiroshi Kadota et al., "An 8–kbit Content–Addressable and Reentrant Memory," IEEE Journal of Solid–State Circuits, vol. sc–20, No. 5, pp. 951–957 Oct. 1985.
Harald Bergh et al., "A Fault–Tolerant Associative Memory with HIgh–Speed Operation," IEEE Journal of Solid–State Circuits, vol. 25, No. 4, pp. 912–919 1990.

* cited by examiner

Primary Examiner—Huan Hoang
(74) Attorney, Agent, or Firm—Price, Heneveld, Cooper, DeWitt & Litton

(57) ABSTRACT

A dynamic content addressable memory (CAM) cell is disclosed which is suitable for constructing relatively high-speed and large-capacity CAM arrays, having binary and ternary storage capability. The cell comprises a pair of storage devices, comparing means and a pair of memory access devices. In a compare operation, the comparing means couples a match line to a discharge line during a mismatch between a pair of complementary search bits carried on a pair of search lines and a pair of complementary data bits stored in the memory. In a read or write operation, the pair of access devices are activated by a word line to couple the storage capacitors to a pair of bit lines. A '0' or a '1' data bit is stored when the two storage capacitors carry complementary charges. A 'don't care' state is stored when both capacitors are discharged.

16 Claims, 6 Drawing Sheets

DYNAMIC CONTENT ADDRESSABLE MEMORY CELL

BACKGROUND OF INVENTION

1. Field of Invention

The present invention relates to dynamic content addressable memory (CAM), and more specifically to dynamic content addressable memory cells suitable for constructing high-speed, large-capacity dynamic CAM arrays.

2. Description of the Backgound Art

Content addressable memory (CAM) is a memory in which a group of memory elements are selected or identified by their content, rather than by their physical location. Generally, CAM includes a matri of CAM cells arranged in rows and columns. Each CAM cell stores one bit of digital data and includes a circuit to allow comparing the stored data with externally provided search data. One or more bits of information in a row constitute a word. A content addressable memory compares a search word with a set of words stored within the CAM. During a search-and-compare operation, an indicator associated with each stored word produces a comparison result, indicating whether or not the search word matches the stored word.

There are several known approaches to CAM cells in the art. A journal paper by Kenneth J. Schultz entitled "Content-addressable Memory Core Cells-A Survey" published in INTEGRATION, the VLSI Journal 23 (1997), pp. 171–188, 1997 describes several CAM cell designs and summarizes the advantages and disadvantages of each. Some of the prior art CAM cells use a static storage element while others use a dynamic storage element. Dynamic storage elements occupy a smaller area on a semiconductor substrate and are therefore preferable to obtain a larger memory capacity on a single integrated circuit chip. Another advantage of the dynamic storage cell is a potential for ternary storage where in addition to the 0 and 1 state, a third "don't care" state can be stored by having similar charges on the two storage capacitors. The original 5-transistor dynamic CAM cell was published by Mundy et al. in "Low-cost associative memory," IEEE Journal of Solid-State Circuits SC-7 (1972) 364–369. See also U.S. Pat. No. 3,701,980 to Mundy. FIG. 1 illustrates the dynamic CAM cell of Mundy et al. redrawn and re-labelled for consistency with an illustration of the present invention given in FIG. 2. As shown in FIG. 1, the prior art first CAM cell 1 has a dynamic storage element in the form of capacitors C1 and C2 which are accessed at bit lines BL1 and BL2 via transistors T1 and T2 respectively. A write or a read operation is performed by turning T1 and T2 on using the word line WL while the match line $ML_i$ is held low to permit data transfer from BL1 and BL2 to C1 and C2, and vice versa. In a search and compare operation, T1 and T2 are held off by a low WL signal, while BL1, BL2 and $ML_i$ are precharged high. Search data is then driven on BL1 and BL2. If the data stored on C1 is high but the search data driven on BL1 is low, current $i_1$ will discharge the $ML_i$ through T4 and T3. Similarly, if the data stored on C2 is high and the search data driven onto BL2 is low, the $ML_i$ will be discharged. If the search data applied to BL1 and BL2 match the data stored on C1 and C2 respectively, no current path exists from $ML_i$ to either BL1 or BL2 and the $ML_i$ remains at the precharged high level. FIG. 1 also shows a second CAM cell 2 in a different word, which has a different matchline, $ML_{i-1}$. The voltage level of $ML_{i-1}$ in a search operation is also influenced by the search data placed on BL1 and BL2 and the values stored on C3 and C4.

There are two disadvantages associated with the prior art CAM cell of FIG. 1. First, the capacitance of bit lines BL1 and BL2 varies depending on the data stored in individual CAM cells connected to those bit lines. Second, the voltage on any one match line (e.g. $ML_i$ or $ML_{i-1}$) obtained during a search-and-compare operation depends not only on the data stored in one word, but also data stored in other words within a given subarray of CAM cells. This occurs because the bit line drivers T3 and T4 have limited current capability, but may be required to discharge several match lines, depending on the data content of cells associated with BL1 and BL2 (e.g. data stored in the first cell 1 and the second cell 2).

These disadvantages place a limit on the number of cells that can be connected to one particular bit line, thereby limiting the size of a subarray and making it more difficult to design a reliable circuit for detecting voltage levels on match lines.

Several variations from the original proposal by Mundy et al. exist in the literature. These include the CAMS cell published by Wade and Sodini in. "Dynamic cross-coupled bit line content addressable memory cell for high density arrays," IEDM Digital Technology Papers (1985), 284–287. See also U.S. Pat. No. 4,831,585 to Wade and Sodini. Another improved CAM cell which uses a dynamic latch circuit, was published by Jones in: "Design, Selection and Imnplementation of a content-addressable memory: alternatives to the ubiquitous RAM," IEEE Computers 22 (1989), 51–64. Yet none of these cited improvements adequately address the problem of variations in bit line capacitance and match line voltage detection.

Kadota et al. presented one static CAM design in: "An 8-Kbit content-addressable and reentrant memory," IEEE Journal on Solid State Circuits SC-20 (1985), 951–957. See also U.S. Pat. No. 4,823,313 to Kadota. In this design, a pair of active pulldown circuits are used between the match line and a ground terminal, each consisting of two transistors in series; the gate of one transistor is connected to one of the two cell nodes and the gate of the other transistor is connected to the corresponding bit line. With the storage device being of the static type, the CAM cell in the Kadota design is limited to binary storage. In order to be able to store a third "don't care" state, an additional storage device would be required.

All the prior art CAM cells referenced above use their bit lines both for the write and read operations for the search-and-compare operations. Such an arrangement places some constraint on the overall operational speed of the CAM cell array. This problem can be alleviated by using search lines for carrying the search data during a search-and-compare operation while using the bit lines only for the write and for the read operations, such as the design published by Bergh et al. in: "A fault-tolerant associative memory with high-speed operation," IEEE Journal on Solid-State Circuits SC-25 (1990) 912–919. This design uses a static memory which is again limited to a binary storage capability. Furthermnore, the search lines in this design are connected to the source or drain terminals of the comparison circuit, causing a heavy loading on the search line thereby causing a relatively high power consumption, and a slower search-and-compare operation.

In view of the above, there is clearly a need for a CAM cell configuration that demands relatively lower power consumption, offers a relatively faster search-and-compare operation with a relatively more stable match line voltage and bit line capacitance, while providing a ternary storage capability.

SUMMARY OF THE INVENTION

An object of the present invention is to provide a improved dynamic content addressable memory (CAM) cell suitable for constructing relatively high-speed and large-capacity CAM arrays, having binary and ternary storage capability.

It is another object of the present invention to provide a CAM cell having a relatively stable voltage level at the match line. It is yet another object of the present invention to provide a CAM array with a relatively stable capacitance at the bit lines.

In accordance with an aspect of the present invention, there is provided a dynamic content addressable memory cell for storing and accessing ternary data, comprising:
   a) a first storage device for storing a first data bit;
   b) a second storage device for storing a second data bit having a value independent of the first data bit;
   c) first and second bit lines connected to the first and second storage devices, respectively, for independently writing the first and second data bits to the first and second data storage devices; and
   d) comparing means having first and second pull-down circuits connected to the first and second storage devices and to second and first search lines, respectively, the second and first search lines being distinct from the first and second bit lines, the first and second pull-down circuits connected between a match line and a discharge line, the comparing means for comparing second and first search bits carried on the second and first search lines to first and second data bits stored in the first and second storage devices, respectively, the comparing means coupling the match line to the discharge line if a mismatch occurs between the first and second search bits and the respective first and second data bits, and when the first and second data bits have complementary values.

In an embodiment of the present invention, the dynamic content addressable memory cell has first and second storage states, wherein the first and second data bits are complementary, and has a third storage state wherein the first and second data bits are non-complementary.

Preferably, each of the first and second storage devices comprise a capacitor, each of a first and second access means comprises a transistor having a gate coupled to the word line, and the comparing means comprises a first pull-down circuit having a first pair of transistors in series having gates thereof coupled to the first storage device and the second search line, and a second pull-down circuit having a second pair of transistors in series having gates thereof coupled to the second storage device and the first search line.

In alternative embodiments of the present invention, the discharge line is either (a) selectively coupled to a low voltage terminal, having a predetermined voltage level between those of a power supply termiinal and a ground terminal; or (b) coupled to a ground terminal through a current limiter preferably formned of a transistor having a gate thereof coupled to a power supply termninal.

In an embodiment of this invention, each of the transistors is an insulated gate field effect transistor (FET) having a drain terminal, a source terminal, and a gate termninal. In such embodiment, the memory cell is fabricated within an integrated circuit using a plurality of semiconductor layers comprising:
   a) an active region in which at least one heavily doped area forms the drain and source terminals of each said FET;
   b) a first poly-silicon conductive layer fonning the gate terminal of each said FET;
   c) a second poly-silicon conductive layer forming the first and second bit lines and at least one interconnection betwveen said active region and said first poly-silicon conductive layer;
   d) a metal conductive layer for providing contacts to selected points in heavily doped areas of said active region and for providing interconnection between said first and second poly-silicon conductive layers; and
   e) third and fourth poly-silicon conductive layers forming first and second plates respectively of each said capacitor; wherein said active region is coupled to an area of said first poly-silicon conductive layer forming a gate of said comparison means via an interconnection formed by said second poly-silicon conductive layer and said metal conductive layer.

Preferably, the memory cell is fabricated within an integrated circuit using a plurality of semiconductor layers comprising.
   a) an active region in which at least one heavily doped area forms the drain and source termninals of each said FET;
   b) a first POIY-silicon conductive layer forming the gate terminal of each said FET;
   c) a second poly-silicon conductive layer forming the first and second bit lines and at least one interconnection between said active region and said first poly-silicon conductive layer;
   d) third and fourth poly-silicon conductive layers formiing first and second plates respectively of each said capacitor; wherein said active region is coupled to an area of said first poly-silicon conductive layer forming a gate of said comparison means via an interconnection formed within said second poly-silicon conductive layer.

Preferably, each of the first and second bit lines is formed in an open line configuration.

In accordance with yet another aspect of the present invention there are provided the following methods:

A method of writing bit data into a dynamic content addressable memory cell for storing and accessing ternary data, comprising the steps of:
   a) holding at a low logic level second and first search lines, the search lines for carrying second and first search bits for comparison respectively with first and second data bits stored in first and second storage devices in the memory cell;
   b) placing bit data on first and second bit lines connected to the first and second storage devices, respectively, for independently writing the first and second data bits to the first and second storage devices, the bit lines distinct from the search lines;
   c) raising to a high logic level a word line, the word line activating first and second access means for coupling the first and second storage devices to the first and second bit lines when raised to a high logic level and deactivating the first and second access means when lowered to a low logic level; and
   d) lowering the word line to a low logic level, thereby storing said bit data in the first and second storage devices.

A method of comparing search data with stored data in a dynamic content addressable memory cell for storing and accessing ternay data, comprising the steps of:
   a) precharging to a predetermined precharge voltage level a match line coupled to the dynamic content addressable memory cell;
   b) placing search data on second and first search lines, the search lines for carrying search data for comparing with first and second data bits stored in first and second storage devices in the memory cell, the search lines being distinct from bit lines for reading from and writing to the storage devices; and c) detecting a voltage change on the match line as an indication of an outcome of comparison between the search data and the stored data.

A method of reading stored data from a dynamic content addressable memory cell for storing and accessing ternary data, comprising the steps of:

a) holding at a low logic level second and first search lines, the search lines for carrying second and first search bits for comparison respectively with first and second data bits stored in first and second storage devices in the memory cell;

b) permitting first and second bit lines connected to the first and second storage devices to float at an intermediate voltage, the bit lines distinct from the search lines;

c) raising to a high logic level a word line, the word line activating first and second access means for coupling the first and second storage devices to the first and second bit lines when raised to a high logic level and deactivating the first and second access means when lowered to a low logic level;

d) sensing and amplifying a difference of voltage level at each of the first and second bit lines from said intermediate voltage level to indicate read data; and e) restoring read data into the first and second storage devices.

BRIEF DESCRIPTION OF THE DRAWINGS

Exemplary embodiments of the invention will now be further described with references to the drawings wherein.

DETAILED DESCRIPTION OF THE INVENTION

Figure 2:
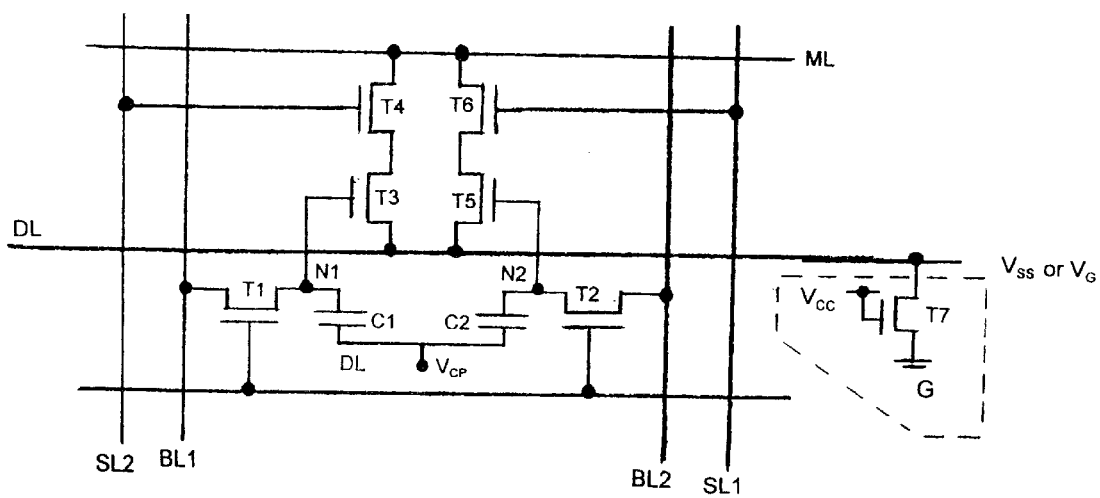
FIG. 2 illustrates a circuit diagram a dynamic CAM cell according to a preferred emodiment of the present invention.

A dynamic CAM cell in accordance with a preferred embodiment of the present invention is illustrated in FIG. 2 in a transistor circuit configuration. As shown in this figure, the CAM cell includes a first and a second storage device in the form of capacitors C1 and C2. Each storage device is capable of storing a '1' (stored voltage is high relative to Vcp) or a '0' (stored voltage is low relative to Vcp). In a binary configuration, the CAM cell stores a binary bit of digital information as '0' on C1 and '1' on C2, or '1' on C1 and '0' on C2. Furthermore, in a ternary configuration the CAM cell attains an additional "don't care" state, when both storage devices store a '0', for example, storing '0' in both C1 and C2.

These capacitors typically have a value of 70 fF each and are fabricated as part of the integrated circuit implementation of the entire CAM cell array using prior art techniques.

For the CAM cell circuit shown in FIG. 2, a number of voltage terminals are used to supply different voltage levels to different parts of the circuit as follows:

a power supply terminmal $V_{DD}$ a ground terminal Vss a cell plate voltage terminal Vcp having a voltage level lying between those of $V_{DD}$ and Vss a low voltage terminal $V_g$ having a voltage level lying between those of $V_{DD}$ and Vss, or ground Vss.

Typical values for $V_{DD}$, Vcp, and Vss would be 3.3V, 1.65V and 0 V respectively.

In the description given below, various points in the circuit of FIG. 2 have their voltages varying between a logic Low level ('0' level), which is taken to be near that of the ground terminal Vss, and a logic High level ('1' level), which is taken to be near that of the power supply terminal $V_{DD}$.

As shown in FIG. 2, the first and second storage devices C1 and C2 have a first and a second cell node N1 and N2 respectively which carry signal levels corresponding to the data stored in the CAM cell; i.e. having a '0', '1' or "don't care" memory content. These two cell nodes N1 and N2 are accessible for write and read operations via a first and a second access device T1 and T2 respectively. The remaining two terminals of the storage devices C1 and C2 are connected to the cell plate voltage terminal Vcp. The source termninals of T1 and T2 are connected to N1 and N2 respectively whereas their drain terminals are connected to a first and a second bit line BL1 and BL2 respectively. The first and second access devices T1 and T2 are responsive to a word line WL by having their gate terminals connected to WL. Data to be written to the storage devices C1 and C2 is placed on the first and second bit lines BL1 and BL2 while activating the first and second access devices T1 and T2 through their gate terminals by raising the voltage level on the word line WL to a voltage Vpp which is higher than $V_{DD}$. The data thus written, can be read at the first and second bit lines BL1 and BL2 by also activating the first and second access devices T1 and T2, as will be further explained below.

The CAM cell fater includes comparing means having first and second pull-down circuits. The first pull-down circuit consists of a third and fourth pull-down devices T3 and T4 respectively connected in series between a match line ML and a discharge line DL, where the drain terminal of T3 is connected to the source terminal of T4. The third pull-down device T3 is responsive to the first cell node N1 by having its gate connected to N1, whereas the gate of T4 is connected to a second search line SL2. Similarly, the second pull-down circuit consists of a fifth and sixth pull-down device T5 and T6 respectively connected between ML and DL, the drain terminal of T5 is connected to the source terminal of T6, the gate terminal of T5 is connected to N2 and the gate of T6 is connected to a first search line SL1. The combination of the first and second pull-down circuits provides a comparison between complementary data bits stored in C1 and C2 and complementary search bits carried on SL1 and SL2, where the result of such comparison is reflected in ML being discharged by the first or the second pull-down circuit if there is a data mismatch as will be futer described below. Alternatively, the order of the series connection of T3 and T4 and of T5 and T6 can be reversed without affecting the comparison operation.

In one embodiment, the discharge line DL is coupled directly to the ground terminal Vss. In an alternative embodiment, the discharge line DL is coupled indirectly to the ground terminal Vss, through a current limiter transistor T7 having its gate terminal coupled to the power supply terminal $V_{DD}$. This transistor acts to limit the current flowing to ground from all the CAM cells where a mismatch exists. In yet another embodiment, the discharge line is coupled to a voltage terminal which is selectively brought to ground by a control circuit (not shown) in order to save power consumption.

The CAM cell circuit is operated to undergo any of a write, a read and a search-and-compare operation by imposing binary signal levels (High or Low) at different points of the circuit. The following table provides a summary of the different signal levels at various circuit points in the operation described below.

TABLE 1

| OPERATION | WL | BL1 | BL2 | N1 | N2 | SL1 | SL2 | ML |
|---|---|---|---|---|---|---|---|---|
| Write "0" to N1 | 1+ | 0 | 1 | 0 | 1 | 0 | 0 | 1 |
| Write "1" to N1 | 1+ | 1 | 0 | 1 | 0 | 0 | 0 | 1 |
| Write "don't care" | 1+ | 0 | 0 | 0 | 0 | 0 | 1 | |
| Read | 1+ | N1 | N2 | N1 | N2 | 0 | 0 | 1 |
| Search (Match) "0" | 0 | X | X | 1 | 0 | 1 | 0 | 1 |
| Search "1" | 0 | X | X | 0 | 1 | 0 | 1 | 1 |
| Search "don't care" | 0 | X | X | X | X | 0 | 0 | 1 |
| ("don't care" stored) | 0 | X | X | 0 | 0 | X | X | 1 |
| Search (Mismatch) | 0 | X | X | 1 | 0 | 0 | 1 | $V_G$ |
| | 0 | X | X | 0 | 1 | 1 | 0 | $V_G$ |

Before beginning a write, a read or a searchand-compare operation, the match line ML is precharged to a predetermined precharge level, which in this embodiment is precharged to a voltage slightly below $V_{DD}$.

Figure 3A:
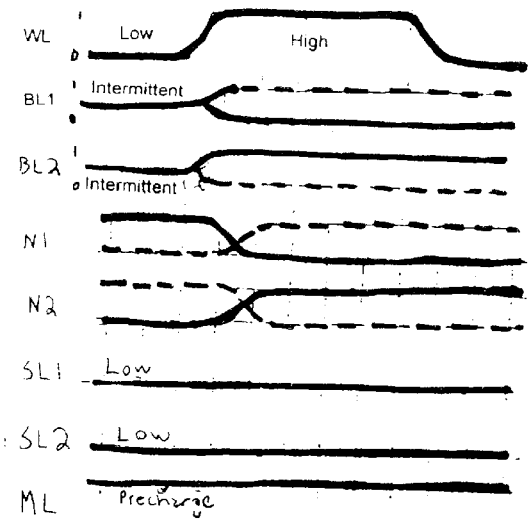
FIGS. 3A, 3B and 3C illustrate three alternative write sequences for the dynamic CAM cell FIG. 2.
Figure 3B:
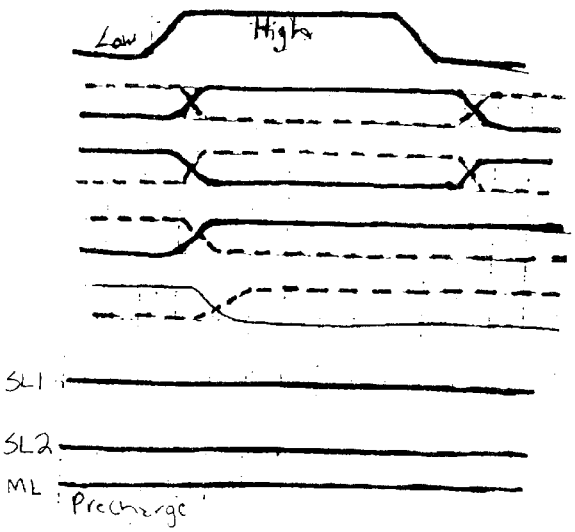
Figure 3C:
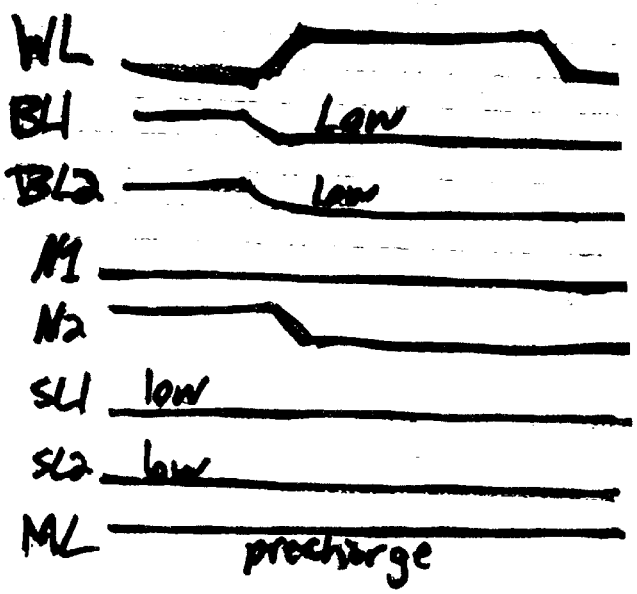

FIGS. 3A, 3B and 3C illustrate three alternative write sequences for the dynamic CAM cell of FIG. 2. As shown in these figures a write sequence consists of the following steps:

(a) The match line ML is held at its precharge level, while the first and second search lines SL1 and SL2 are held at Low level.

(b) Binary signal levels (logic High and Low) corresponding to data to be written to the CAM cell are placed on the first and second bit lines BL1 and BL2.

(c) The word line WL is raised to Vpp level (higher than $V_{DD}$) so that the first storage capacitor C1 is charged causing the first cell node N1 to attain the signal level at BL1 and the second storage capacitor C2 is charged causing the second cell node N2 to attain the signal level on BL2.

(d) The signal level at word line WL is then lowered to Vss and the signal levels attained at the first and second nodes N1 and N2 are stored on the first and second capacitors C1 and C2 respectively.

The sequences shown in FIGS. 3A and 3B relate to the writing of a binary bit represented by a complementary pair of Low (0) and High (1) signals placed on BL1 and BL2. The solid lines for BL1, BL2, N1 and N2 illustrate one complementary pair of signals whereas the dotted lines illustrate another complementary pair opposite to what is shown by the solid lines. FIG. 3A relates to a write sequence beginning with BL1 and BL2 at an intermediate level which falls between High and Low. The intermnediate level is typically half $V_{DD}$ relative to Vss.

FIG. 3B relates to a write sequence beginning with BL1 and BL2 at states other than the intermediate level, such as the case where the write sequence is immediately preceded by a previous write sequence, where BL1 and BL2 did not have sufficient time to return to their intermediate level, for example, during a burst write operation where a predetermined number of CAM cells are written sequentially.

With reference to FIG. 3C, a ternary data write example is illustrated. In this sequence, both BL1 and BL2 carry a '0' which is to be written into the two halves of the cell on nodes N1 and N2 respectively. The steps involved in the ternary data write sequence are the same as those involved with a normal binary write sequence as a described above, i.e.

(a) The match line ML is held at its precharge level, while the first and second search lines SL1, SL2 are held at Low level.

(b) Low logic level signals '0' are placed on BL1 and BL2 respectively.

(c) The word line WL is raised to Vpp so that the access transistors T1 and T2 conduct fully and pass the bit line data onto nodes N1 and N2 respectively.

(d) The word line WL is lowered to VSS and the '0' data on nodes N1 and N2 is stored on capacitors C1 and C2 respectively.

Since both nodes N1 and N2 are logic low or '0', neither one of the pull-down transistors T3 or T5 will be enabled. As a result, any search data presented during a search and compare operation to the gates of pulldown transistors T4 and T6 will effectively be ignored and cannot create a path between the match line ML and the discharge line DL, hence this data '0' storedon both nodes N1 and N2 represents the "don't care" state of the CAM cell, i.e. The third type of state which can be stored by the cell.

Figure 4:
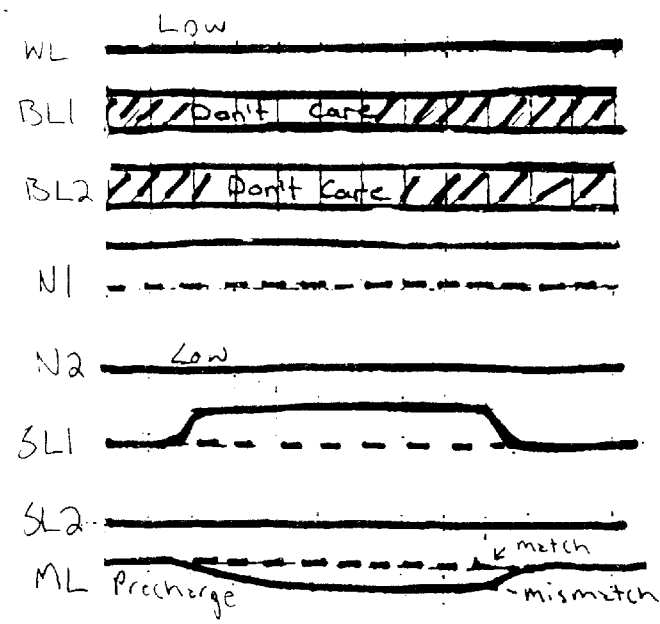
FIG. 4 illustrates signal levels and timing for a search sequence for the dynamiic CAM cell of FIG. 2.

FIG. 4 illustrates a search and compare sequence for the dynamic CAM cell of FIG. 2, consisting of the following steps:

(a) During the entire search and compare sequence, the word line WL is held at Low level, whereas the first and second bit lines BL1 and BL2 may be held at their precharge level or may be driven to '0' or '1' or may float.

(b) The match line ML begins at its precharge level at $V_{DD}$ or slightly below below $V_{DD}$.

(c) Binary signal levels (High and Low) corresponding to search data to be compared with data stored in the CAM cell, are placed on the first and second search lines SL1 and SL2, in this case, SL1='1', SL2='0'.

(d) The result of comparing the search data with the stored data is indicated by the ensuing signal level on ML. If the search data is the same as the stored data, i.e. if there is a match, then ML remains at its precharge level since neither of the first or second pull-down circuits has both its transistors conducting. If the search data is different from the stored data, i.e. if there is a mismatch, then one of the two pull-down circuits will be activated since both of its transistors will be conducting, allowing current to flow therethrough and pulling down ML to a signal level below its precharged level. In this case, for examnple, if SL1='0' and SL2='1' and N1='1', there would be a mismatch and transistors T3 and T4 would conduct, thereby pulling ML away from its precharge as shown by the dotted line in FIG. 4.

It should be noted that the first and second pull-down circuits perform the comparison of the search data carried on the first and second search lines SL1 and SL2, with the stored data present at the first and second nodes N1 and N2, together. In order for a match to occur, neither the first nor the second pull-down circuit should conduct. In order for a mismatch to occur, either of the first or the second pull-down circuit should conduct. In FIG. 4, the solid lines relate to the case where the search data match the stored data, whereas the dotted lines relate to the case where the search data mismatch the stored data.

Figure 5:
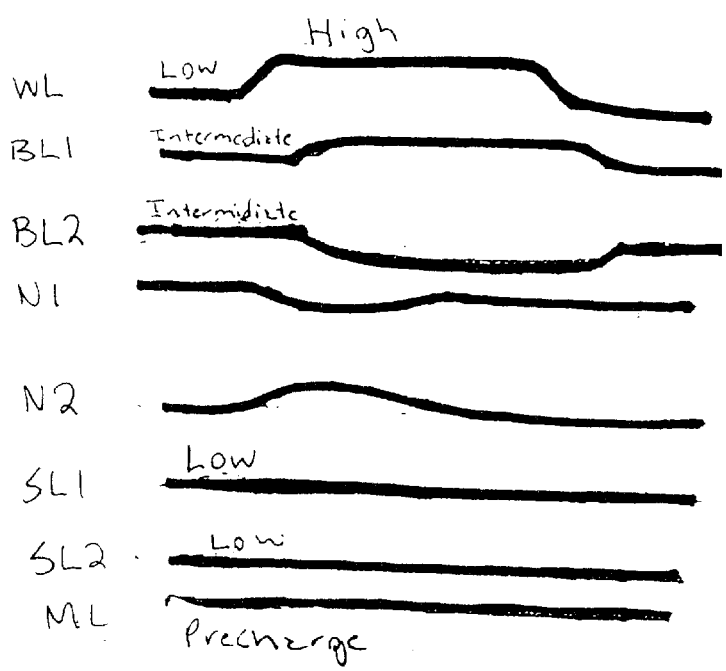
FIG. 5 illustrates signal levels and timing for a read sequence for the dynamic CAM cell of FIG. 2.

FIG. 5 illustrates a read sequence for the dynamic CAM cell of FIG. 2, consisting of the following steps:

(a) During the entire read sequence, ML is held at its precharge level, whereas the search lines SL1 and SL2 are held at Low level.

(b) The bit lines BL1 and BL2 begin by being precharged to their intermediate level ($V_{DD}/2$).

(c) The word line WL is raised to Vpp level to permit charge sharing between BL1 and C1, and between BL2 and C2 so that voltage levels at BL1 and BL2 begin to deviate from the initial precharge level to track the data stored in C1 and C2.

(d) The differences of the deviated signal level at BL1 and BL2 from their precharge level are sensed and amplified by first and second bit line sense amplifiers (shown in FIG. 8 as SA1 and SA2 respectively) to provide an output of the read sequence.

(e) The amplified output of the read sequence is then used to restore the data originally stored in the CAM cell by recharging C1 and C2 to their state just prior to the read sequence.

It is important to note that unlike the prior art circuits, the embodiment of the present invention described above has an open bit line architecture, i.e. BL1 and BL2 are not necessarily "of opposite" phase and in fact have separate sense amplifiers. Open bit line architecture allows for ternary data storage and access.

Figure 1:
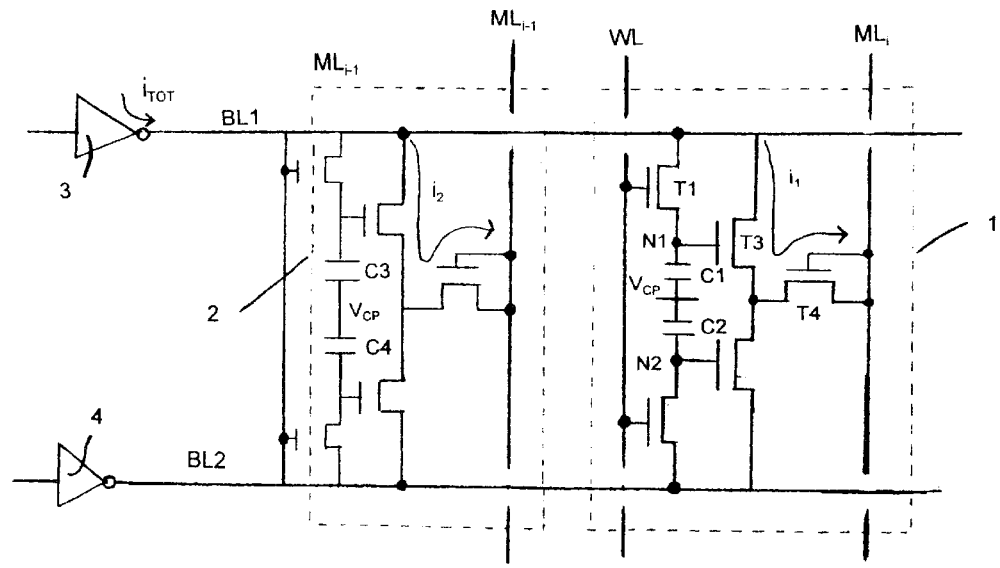
FIG. 1 illustrates a circuit diagram a prior art dynamic CAM cell.
Figure 8:
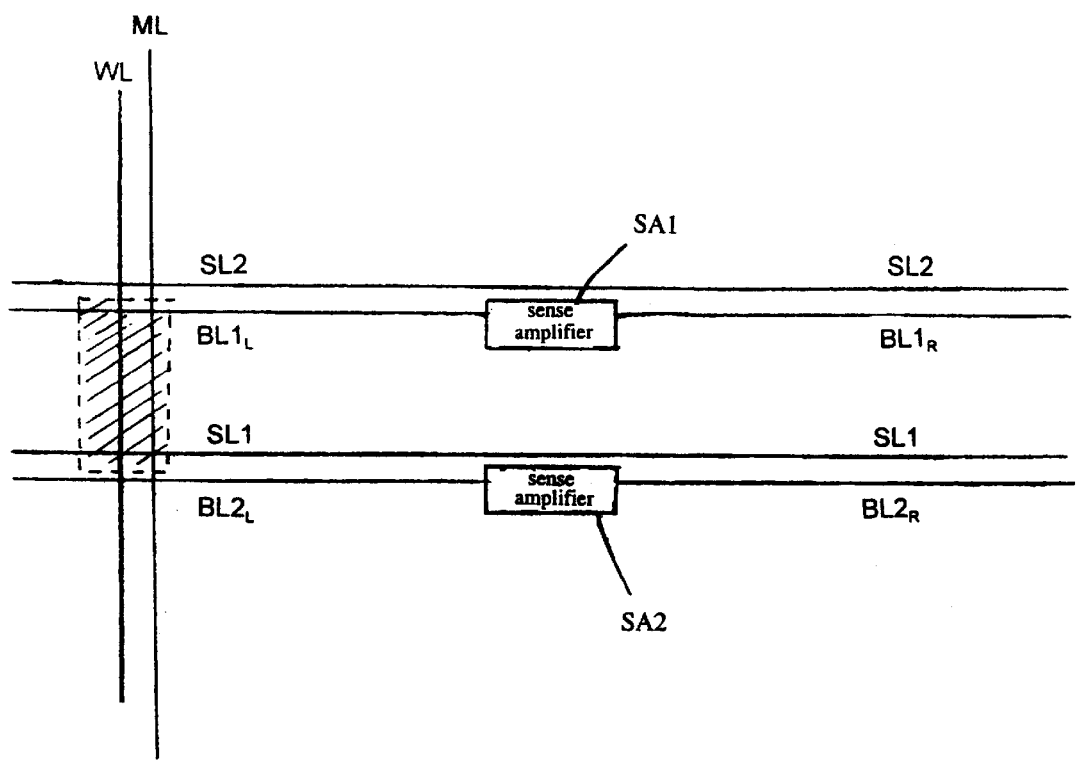
FIG. 8 illustrates the open bit-line configuration used for connecting the dynamic, CAM cell of FIG. 1 in accordance with this invention.
Figure 1:
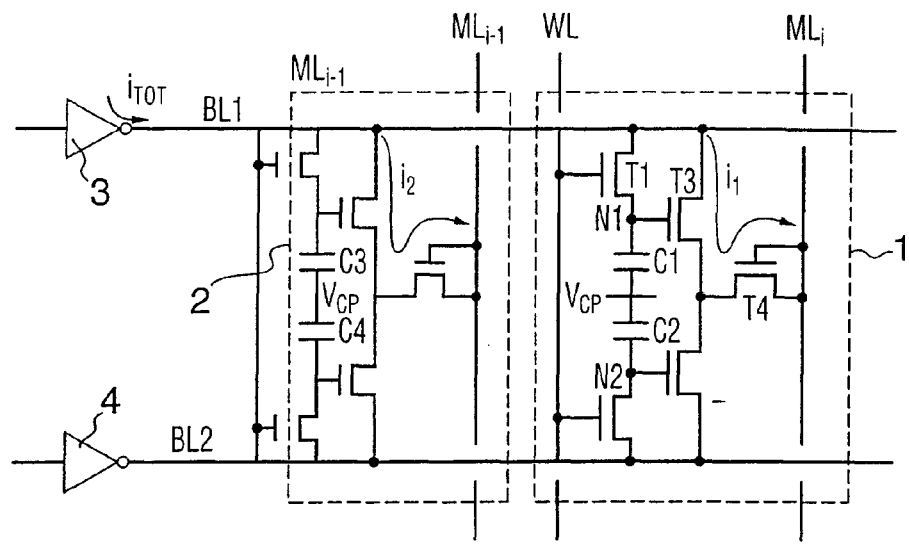
Figure 2:
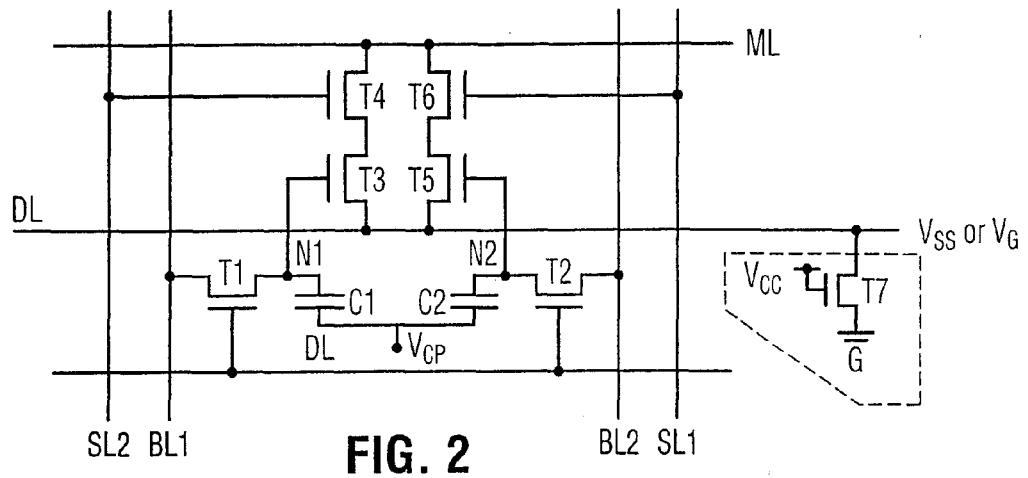
Figure 3A:
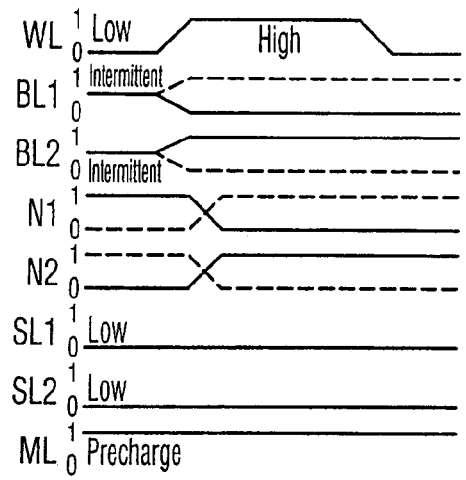
Figure 3B:
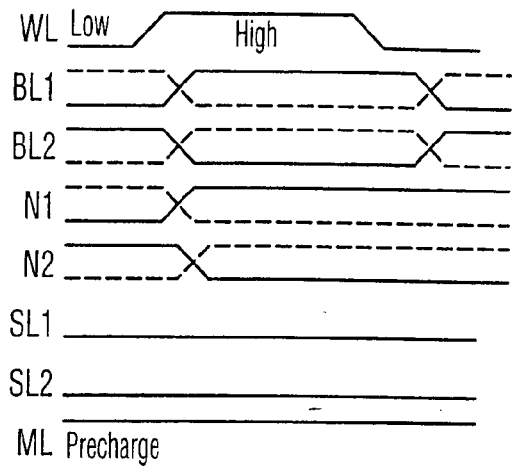
Figure 3C:
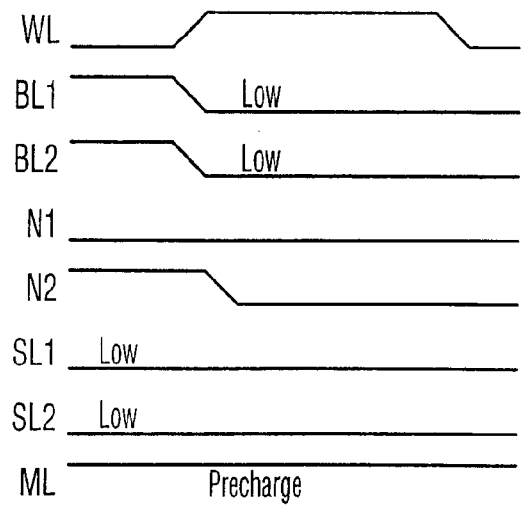
Figure 4:
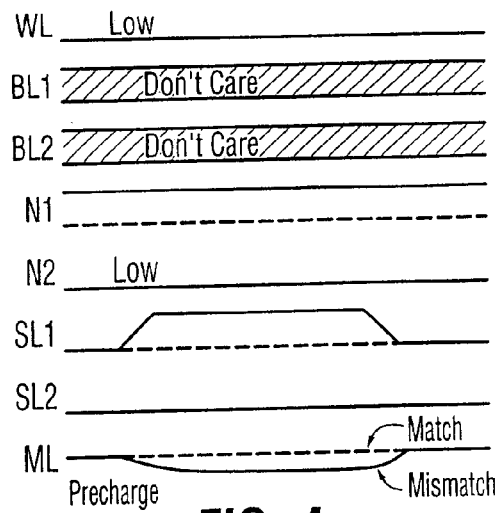
Figure 5:
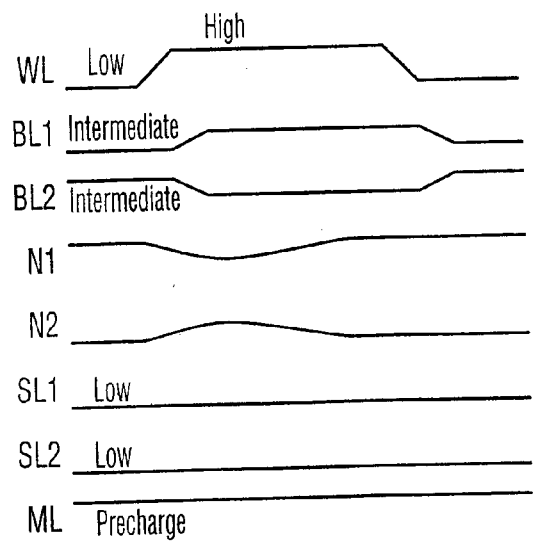
Figure 6B:
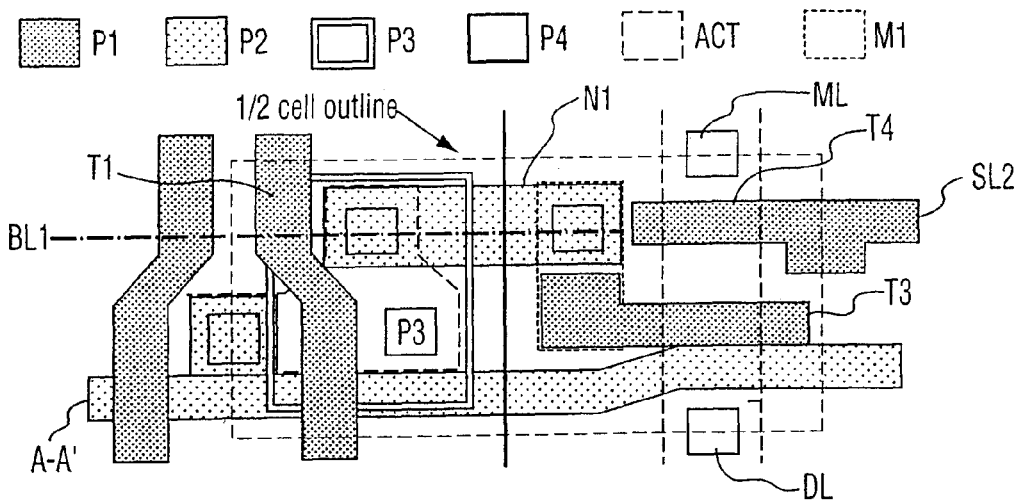
Figure 6A:
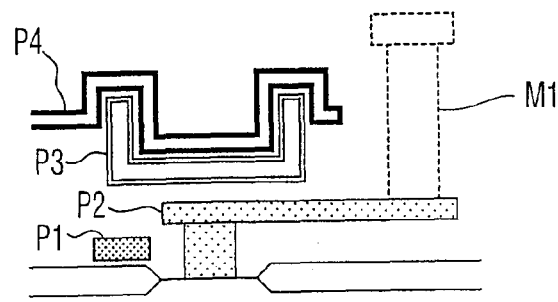
Figure 7A:
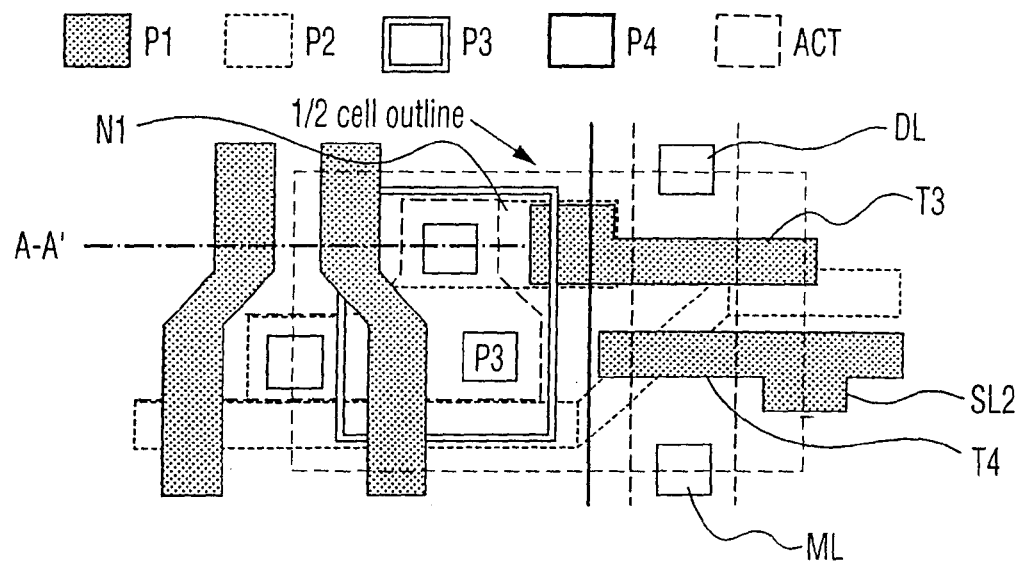
Figure 7B:
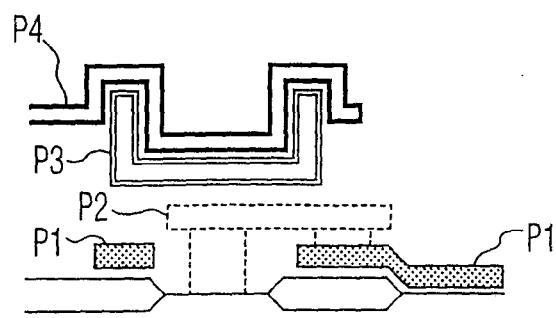
Figure 8:
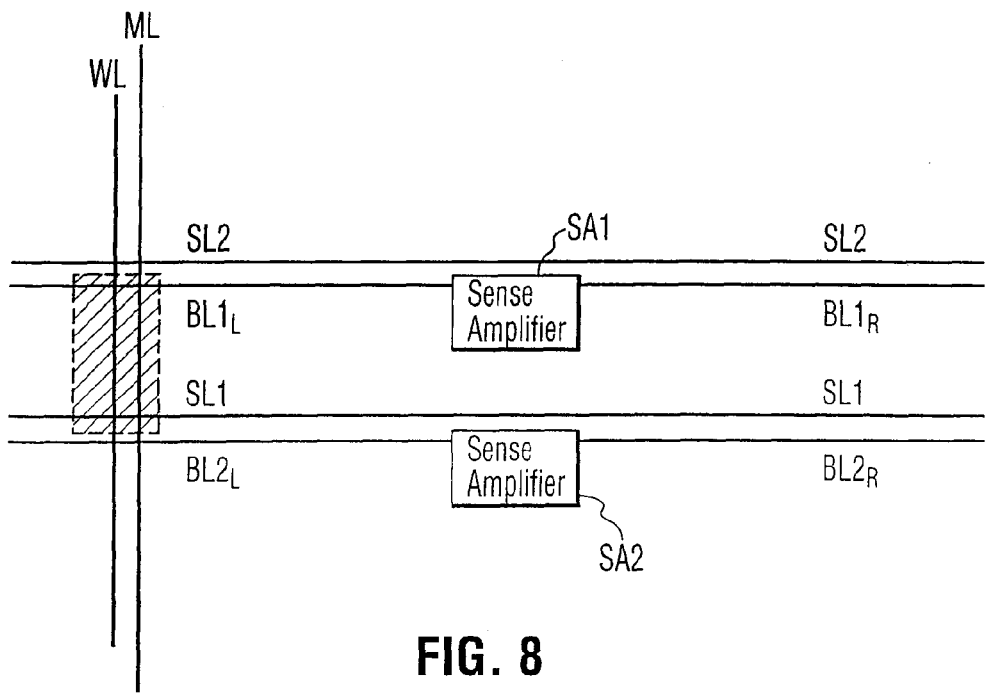

In another embodiment of the present invention, the bit lines are arranged as shown in FIG. 8 in an open bit line configuration whereby the right side $BL1_R$ of BL1 and the right side $BL2_R$ of BL2 are positioned relatively far apart from the respectively left sides $BL1_L$ and $BL2_L$ of BL1 and BL2. Bit lines on each side of the sense amplifier are at equal length to provide a balanced load during sensing. This structure allows a ternary data storage capability within the CAM cell described above in conjunction with FIG. 1.

Figure 6B:
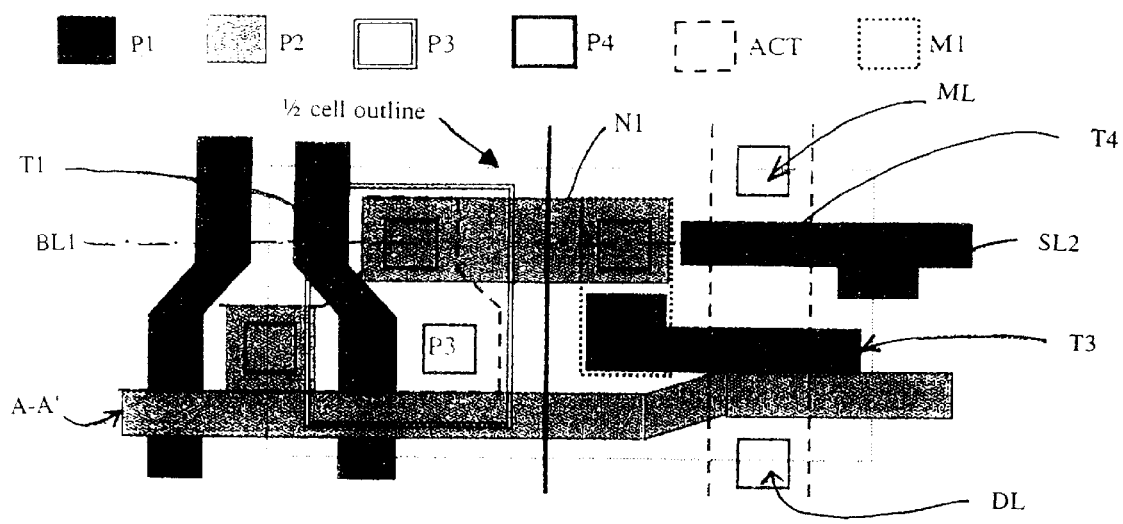
FIG. 6B is a cross sectional view of the dynamic CAM cell taken along a line corresponding, to line A–A' of FIG. 6A.
Figure 6A:
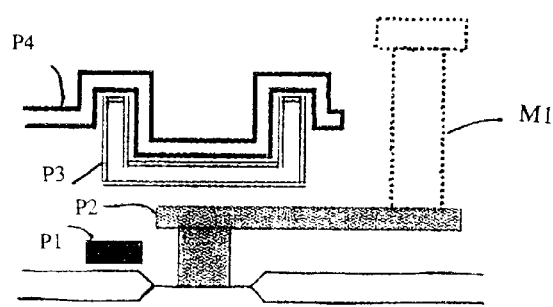
FIG. 6A illustrates a mask layout for fabricating the dynamic CAM cell of FIG. 2 according to an embodiment of this invention.

FIGS. 6A and 6B illustrate a mask layout and a cross sectional view for integrated circuit fabrication of one embodiment of the dynamic CAM cell of FIG. 2. Here, each of the transistor devices T1–T7 shown in FIG. 2 is an insulated gate field effect transistor (FET) having a drain terminal, a source terminal, a gate terminal and a channel between the drain and source terminals, and each of the storage devices C1 and C2 is made of two poly-silicon layers P3 and P4 separated by a dielectric, as is known in the DRAM industry. The integrated circuit layout illustrated in FIGS. 6A and 6B consists of:

(a) a heavily doped semiconductor active (ACT) region for forming the drain and source terminals, and the channel for each FET T1 to T7;

(b) a first poly-silicon layer (P1) for forming the gate terminal for each FET;

(c) a second poly-silicon layer (P2) for forming the first and second bit lines BL1 and BL2 and local interconnections;

(d) a third poly-silicon layer (P3) for forming the bottom plate of the cell capacitors C1 and C2;

(e) a fourth poly-silicon layer (P4) for forming the top plate of the cell capacitors C1 and C2; and, (f) a conductive metal layer (M1) for providing further local interconnections as well as contacts to the active regions as will be described below.

With reference to FIG. 6A and FIG. 6B, the cell structure according to one embodiment of the invention is herein described in the context of a stacked capacitor DRAM fabrication process. The elements shown in FIG. 6A correspond with only one half of the full CAM cell shown in FIG. 2, specifically with the left half of FIG. 2 including the transistors T1, T3 and T4 and the first capacitor C1. The left half of FIG. 6A is the storage portion of the CAM cell comprised of transistors T1 and capacitor C1. The right half of FIG. 6A is the search portion of the CAM cell comprised of the transistors T3 and T4. One of the source drain terminals of T1 is connected to the first bit line BL1 in the second poly-silicon layer (P2). As illustrated by the dashed line labeled "½ cell outline", the BL1 contact is actually shared between T1 and an adjacent cell to the left of the structure shown in FIG. 6A. The first poly-silicon layer (P1) forms the gate of T1. The other source/drain terminal of T1 (N1) is connected to capacitor C1 through a P3 contact, and to a local interconnect P2 segment. The first capacitor C1 is formed on top of transistor T1 by the P3 and P4 structure shown in FIG. 6A (see also FIG. 6B for the cross-sectional view through section A–A'). In FIG. 6B, P4 and P3 are separated by a dielectric material which is not explicitly shown, but is well-known to those skilled in the art. The first cell node N1 is then connected from the local interconnect PC to the gate of T3 by a metal connection in the first metal layer (M1). This M1 contact must be located outside the area of the P4 layer as shown in FIG. 6B, but represents a suitable connection solution if the additional process steps required to connect P3 directly to P1 or to connect P1 directly to P2 (which is a preferred embodiment to be described in detail with reference to FIGS. 7A and 7B below) are not available. Transistor T3 is formed by the active region (ACT) and the P1 gate, and transistor T4 is formed by the active region and another P1 gate which has a contact to the second search line SL2 also shared with another adjacent cell. Note that the M1 contacts of T3 and T4 to the discharge line DL and the match line ML are shared with adjacent cells as was described with respect to the BL1 contact.

Figure 7A:
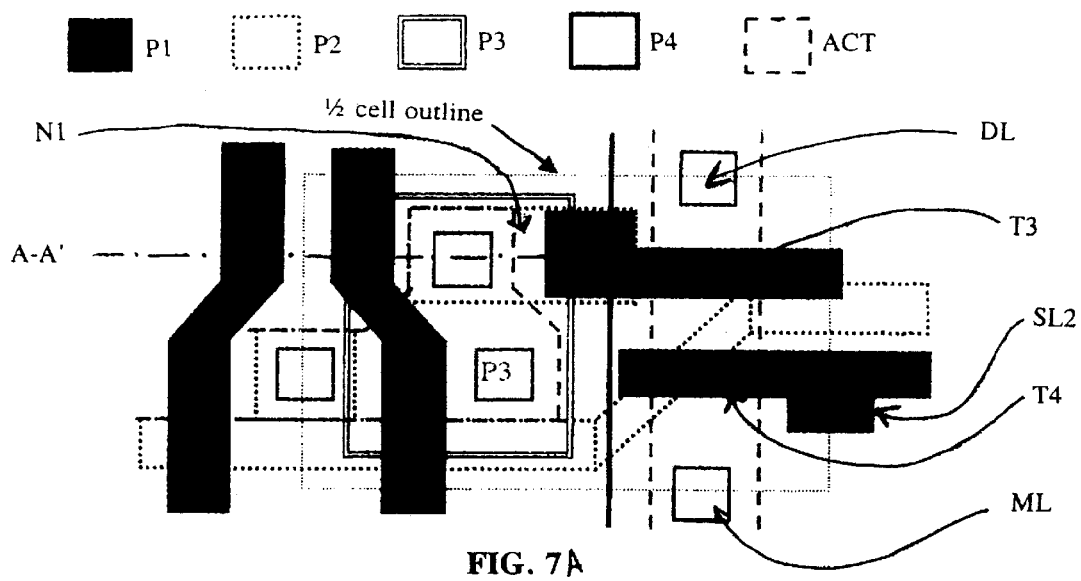
FIG. 7A illustrates a mask layout for fabricating the dynamic CAM cell of FIG. 2 in accordance with a preferred embodiment of this invention.
Figure 7B:
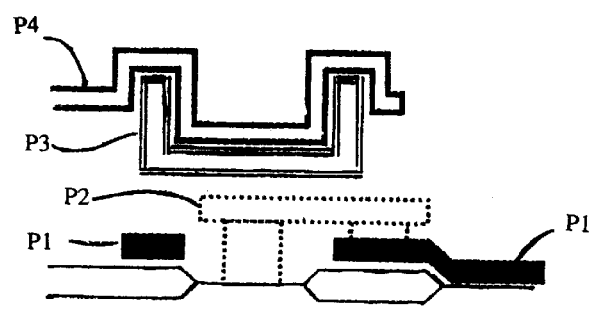
FIG. 7B is a cross sectional view of the CAM cell taken along a line corresponding to line A–A' of FIG. 7A.

According to a preferred embodiment of the invention as illustrated in FIGS. 7A and 7B, the cell structure is substantially reduced compared to the cell shown in FIG. 6A. The improvement over the structure in FIG. 6A essentially consists of swapping the position of the match line ML and the discharge line DL and then making a direct contact from node N1 in P2 to the gate of T3 in P1. As a result, there is no need for the M1 contact of the previous embodiment shown in FIG. 6A, so that the connection from N1 to the gate of T3 can be located underneath the P3–P4 capacitor, allowing the cell to be much more densely packed. This requires an additional process step for connecting the two poly-silicon layers. If this additional process step is available, this preferred embodiment should be used to achieve a denser array. With reduced bit line length, the DRAM cell to bit line capacitance is reduced, and the speed of operation is accordingly increased. Similarly, if a direct P3 to P1 contact was available, the N1 contact to gate of T3 could be located underneath the P3–P4 capacitor. If such additional process steps are not available, the embodiment of FIG. 6A and 6B should be used.

The circuit design in FIG. 2 is a preferred embodiment of the present invention and is presented for illustration purposes only. Other alternative embodiments can be readily derived without departing from the spirit of the invention.

What is claimed is:

1. A dynamic content addressable memory cell for storing and accessing ternary data, comprising:
   a) a first storage device for storing a first data bit;
   b) a second storage device for storing a second data bit having a value independent of the first data bit;
   c) first and second bit lines connected to the first and second storage devices, respectively, for independently writing the first and second data bits to the first and second data storage devices; and
   d) comparing means having first and second pull-down circuits connected to the first and second storage devices and to second and first search lines, respectively, the second and first search lines being distinct from the first and second bit lines, the first and second pull-down circuits connected between a match line and a discharge line, the comparing means for comparing second and first search bits carried on the second and first search lines to first and second data bits stored in the first and second storage devices, respectively, the comparing means coupling the match line to the discharge line if a mismatch occurs between the first and second search bits and the respective first and second data bits, and when the first and second data bits have complementary values.

2. The dynamic content addressable memory cell as defined in claim 1, having first and second storage states, wherein the first and second data bits are complementary, and having a third storage state wherein the first and second data bits are non-complementary.

3. The dynamic content addressable memory cell as defined in claim 1, wherein each of the first and second storage devices include a capacitor.

4. The dynamic content addressable memory cell as defined in claim 1, wherein the first pull-down circuit includes a first pair of transistors in series having gates thereof coupled to the first storage device and the second search line, and the second pull-down circuit includes a second pair of transistors in series having gates thereof coupled to the second storage device and the first search line.

5. The dynamic content addressable memory cell as defined in claim 1, wherein the discharge line is selectively coupled to a low voltage terminal, having a predetermined voltage level between those of a power supply terminal and a ground terminal.

6. The dynamic content addressable memory cell as defined in claim 1, wherein the first and second bit lines are open bit lines.

7. The dynamic content addressable memory cell as defined in claim 1, wherein the discharge line is coupled to a ground terminal through a current limiter.

8. The dynamic content addressable memory cell as defined in claim 7, wherein the current limiter is formed of a transistor having a gate thereof coupled to a power supply terminal.

9. The dynamic content addressable memory cell as defined in claim 1, further including:
   first and second access means for coupling said first and second storage devices to the first and second bit lines respectively when said first and second access means are activated by a word line.

10. The dynamic content addressable memory cell as defined in claim 9, wherein the first and second access means each include a transistor having a gate coupled to the word line.

11. The dynamic content addressable memory cell as defined in claim 10, wherein each transistor is an insulated gate field effect transistor (FET) having a drain terminal, a source terminal, and a gate terminal.

12. The dynamic content addressable memory cell as defined in claim 11 fabricated within an integrated circuit having a plurality of semiconductor layers including:
   a) an active region in which at least one heavily doped area forms the drain and source terminals of each said FET;
   b) a first poly-silicon conductive layer forming the gate terminal of each said FET;
   c) a second poly-silicon conductive layer forming the first and second bit lines and at least one interconnection between said active region and said first poly-silicon conductive layer;
   d) a metal conductive layer for providing contacts to selected points in heavily doped areas of said active region and for providing interconnection between said first and second poly-silicon conductive layers; and
   e) third and fourth poly-silicon conductive layers forming first and second plates respectively of each said capacitor;
wherein said active region is coupled to an area of said first poly-silicon conductive layer forming a gate of said comparing means via an interconnection formed by said second poly-silicon conductive layer and said metal conductive layer.

13. The dynamic content addressable memory cell as defined in claim 11 fabricated within an integrated circuit having a plurality of semiconductor layers, including:
   a) an active region in which at least one heavily doped area forms the drain and source terminals of each said FET;
   b) a first poly-silicon conductive layer forming the gate terminal of each said FET;
   c) a second poly-silicon conductive layer forming the first and second bit lines and at least one interconnection between said active region and said first poly-silicon conductive layer; and
   d) third and fourth poly-silicon conductive layers forming first and second plates respectively of each said capacitor;
wherein said active region is coupled to an area of said first poly-silicon conductive layer forming a gate of said comparing means via an interconnection formed within said second poly-silicon conductive layer.

14. A method of writing bit data into a dynamic content addressable memory cell for storing and accessing ternary data, comprising the steps of:
   a) holding at a low logic level second and first search lines, the search lines for carrying second and first search bits for comparison respectively with first and second data bits stored in first and second storage devices in the memory cell;

b) placing bit data on first and second bit lines connected to the first and second storage devices, respectively, for independently writing the first and second data bits to the first and second storage devices, the bit lines distinct from the search lines;

c) raising to a high logic level a word line, the word line activating first and second access means for coupling the first and second storage devices to the first and second bit lines when raised to a high logic level and deactivating the first and second access means when lowered to a low logic level; and d) lowering the word line to a low logic level, thereby storing said bit data in the first and second storage devices.

15. A method of comparing search data with stored data in a dynamic content addressable memory cell for storing and accessing ternary data, comprising the steps of:

a) precharging to a predetermined precharge voltage level a match line coupled to the dynamic content addressable memory cell;

b) placing search data on second and first search lines, the search lines for carrying search data for comparing with first and second data bits stored in first and second storage devices in the memory cell, the search lines being distinct from bit lines for reading from and writing to the storage devices; and c) detecting a voltage change on the match line as an indication of an outcome of comparison between the search data and the stored data.

16. A method of reading stored data from a dynamic content addressable memory cell for storing and accessing ternary data, comprising the steps of:

a) holding at a low logic level second and first search lines, the search lines for carrying second and first search bits for comparison respectively with first and second data bits stored in first and second storage devices in the memory cell;

b) permitting first and second bit lines connected to the first and second storage devices to float at an intermediate voltage, the bit lines distinct from the search lines;

c) raising to a high logic level a word line, the word line activating first and second access means for coupling the first and second storage devices to the first and second bit lines when raised to a high logic level and deactivating the first and second access means when lowered to a low logic level;

d) sensing and amplifying a difference of voltage level at each of the first and second bit lines from said intermediate voltage level to indicate read data; and e) restoring read data into the first and second storage devices.

* * * * *

UNITED STATES PATENT AND TRADEMARK OFFICE
CERTIFICATE OF CORRECTION

PATENT NO.     : 6,320,777 B1
DATED          : November 20, 2001
INVENTOR(S)    : Valarie Lines et al.

It is certified that error appears in the above-identified patent and that said Letters Patent is hereby corrected as shown below:

Title page,
The title page, showing the illustrative figure should be deleted and replaced with the attached title page.

Drawings,
Sheet 1-6, consisting of Figs. 1,2, 3A-C, 4, 5, 6A and 6B, 7A and 7B, and 8, should be deleted and substitute the corrected drawing Figs. 1, 2, 3A-3C, 4, 5, 6A, and 6B, and 7A and 7B, and 8, as shown on the attached pages.

Signed and Sealed this

Twenty-fifth Day of June, 2002

Attest:

JAMES E. ROGAN
Attesting Officer      Director of the United States Patent and Trademark Office

(12) United States Patent
Lines et al.

(10) Patent No.: US 6,320,777 B1
(45) Date of Patent: Nov. 20, 2001

(54) DYNAMIC CONTENT ADDRESSABLE MEMORY CELL

(75) Inventors: Valerie Lines, Ottawa; Peter B. Gillingham, Kanata; Abdullah Ahmed, Scarborough; Tomasz Wojcicki, Kanata, all of (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 09/533,128

(22) Filed: Mar. 23, 2000

(30) Foreign Application Priority Data

Mar. 31, 1999 (CA) .................................................. 2266062

(51) Int. Cl.[7] .................................................. G11C 15/00
(52) U.S. Cl. .................................. 365/49; 365/189.07
(58) Field of Search .............................. 365/49, 189.07

(56) References Cited

U.S. PATENT DOCUMENTS

| | | |
|---|---|---|
| 3,701,980 | 10/1972 | Mundy . |
| 4,791,606 * | 12/1988 | Threewitt et al. ............. 365/49 |
| 4,823,313 | 4/1989 | Kadota . |
| 4,831,585 | 5/1989 | Wade et al. . |
| 4,833,643 | 5/1989 | Hori . |
| 4,965,767 * | 10/1990 | Kimoshita et al. .............. 365/49 |
| 5,111,427 | 5/1992 | Kobayashi et al. . |
| 5,146,300 | 9/1992 | Hamamoto et al. . |
| 5,319,589 | 6/1994 | Yamagata et al. . |
| 5,396,449 | 3/1995 | Atallah et al. . |
| 5,446,685 | 8/1995 | Holst . |
| 5,515,310 | 5/1996 | Winters . |
| 5,859,791 | 1/1999 | Shultz et al. . |
| 5,930,161 * | 7/1999 | Sheikholeslami et al. ........... 365/49 |
| 5,949,696 * | 9/1999 | Threewitt ........................ 365/49 |
| 6,044,005 * | 3/2000 | Gibson et al. .................... 365/49 |

OTHER PUBLICATIONS

Kenneth J. Schultz, "A Survey of Content–Addressable Memory Cells," VLSI Journal, vol. 23, pp. 171–188, 1997.
Joseph L. Mundy et al., "Low–Cost Associative Memory," IEEE Journal of Solid–State Circuits, sc–7, pp. 364–369, 1972.
Sergio R. Ramirez–Chavez, "Encoding Don't Cares in Static and Dynamic Content–Addressable Memories," IEEE Transactions on Circuits and Systems II: Analog and Digital Signal Processing 39, No. 8, pp. 575–578, Aug. 1992.
Hiroshi Kadota et al., "An 8–kbit Content–Addressable and Reentrant Memory," IEEE Journal of Solid–State Circuits, vol. sc–20, No. 5, pp. 951–957 Oct. 1985.
Harald Bergh et al., "A Fault–Tolerant Associative Memory with HIgh–Speed Operation," IEEE Journal of Solid–State Circuits, vol. 25, No. 4, pp. 912–919 1990.

* cited by examiner

Primary Examiner—Huan Hoang
(74) Attorney, Agent, or Firm—Price, Heneveld, Cooper, DeWitt & Litton

(57) ABSTRACT

A dynamic content addressable memory (CAM) cell is disclosed which is suitable for constructing relatively high-speed and large-capacity CAM arrays, having binary and ternary storage capability. The cell comprises a pair of storage devices, comparing means and a pair of memory access devices. In a compare operation, the comparing means couples a match line to a discharge line during a mismatch between a pair of complementary search bits carried on a pair of search lines and a pair of complementary data bits stored in the memory. In a read or write operation, the pair of access devices are activated by a word line to couple the storage capacitors to a pair of bit lines. A '0' or a '1' data bit is stored when the two storage capacitors carry complementary charges. A 'don't care' state is stored when both capacitors are discharged.

16 Claims, 6 Drawing Sheets

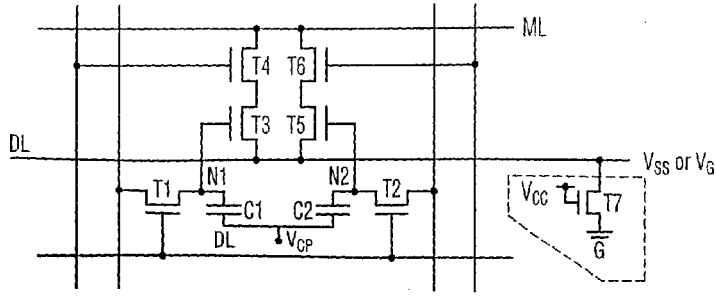

UNITED STATES PATENT AND TRADEMARK OFFICE
CERTIFICATE OF CORRECTION

PATENT NO. : 6,320,777 B1
DATED : November 20, 2001
INVENTOR(S) : Lines et al.

It is certified that error appears in the above-identified patent and that said Letters Patent is hereby corrected as shown below:

Column 1,
Line 14, "matri" should be -- matrix --.

Column 2,
Line 19, ". (period)" should be -- : (colon) --.
Line 25, "Imnplementation" should be -- Implementation --.

Column 3,
Line 53, "formned" should be -- formed --.
Line 64, "fonning" should be -- forming --.

Column 4,
Line 1, "betwveen" should be -- between --.
Line 20, "POIY-silicon" should be -- poly-silicon --.
Lines 26 & 27, "formiing" should be -- forming --.

Column 5,
Lines 35 & 37, after "illustrates" insert -- in --.
Line 42, "dynamiic" should be -- dynamic --.

Column 6,
Line 55, "fater" should be -- further --.

Column 7,
Line 7, "futer" should be -- further --.
Table 1, line 3, "Write "don't care" 1 + 0 0 0 0 0 1 (sp)" should be -- Write "don't care" 1 + 0 0 0 0 0 0 1 --.
Line 43, "searchand-compare" should read -- search-and-compare --.

Column 8,
Line 52, "storedon" should read -- stored on --.

UNITED STATES PATENT AND TRADEMARK OFFICE
CERTIFICATE OF CORRECTION

PATENT NO.    : 6,320,777 B1
DATED         : November 20, 2001
INVENTOR(S)   : Lines et al.

It is certified that error appears in the above-identified patent and that said Letters Patent is hereby corrected as shown below:

Column 10,
Line 32, "source drain" should be -- source/drain --.

Signed and Sealed this

Twelfth Day of November, 2002

Attest:

Attesting Officer

JAMES E. ROGAN
*Director of the United States Patent and Trademark Office*